United States Patent
Kim et al.

(10) Patent No.: US 7,701,262 B2
(45) Date of Patent: Apr. 20, 2010

(54) TRANSMISSION LINE DRIVERS AND SERIAL INTERFACE DATA TRANSMISSION DEVICES INCLUDING THE SAME

(75) Inventors: Chi Won Kim, Gyeonggi-do (KR); Ji Young Kim, Gyeonggi-do (KR); Myoung Bo Kwak, Incheon (KR); Jong Shin Shin, Gyeonggi-do (KR); Seung Hee Yang, Gyeonggi-do (KR); Hyun-Goo Kim, Gyeonggi-do (KR); Jae Hyun Park, Daegu (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 76 days.

(21) Appl. No.: 11/880,492

(22) Filed: Jul. 23, 2007

(65) Prior Publication Data

US 2008/0024178 A1   Jan. 31, 2008

(30) Foreign Application Priority Data

Jul. 25, 2006   (KR) ...................... 10-2006-0069467

(51) Int. Cl.
  *H03B 1/00* (2006.01)
(52) U.S. Cl. ....................... 327/108; 327/112; 327/170; 327/379; 326/21; 326/30; 326/83; 330/258
(58) Field of Classification Search ......... 327/108–112, 327/170, 379, 389, 391, 63–70, 563; 326/21–24, 326/26–27, 30, 82–83, 87; 330/258
See application file for complete search history.

(56) References Cited

U.S. PATENT DOCUMENTS

| | | | | | |
|---|---|---|---|---|---|
| 5,831,458 | A | * | 11/1998 | Nakagawa | 327/108 |
| 5,977,796 | A | * | 11/1999 | Gabara | 326/86 |
| 6,281,715 | B1 | * | 8/2001 | DeClue et al. | 327/65 |
| 6,445,225 | B2 | * | 9/2002 | Andre | 327/112 |
| 6,720,805 | B1 | * | 4/2004 | Haas | 327/108 |
| 7,279,934 | B2 | * | 10/2007 | Do | 326/83 |
| 7,345,602 | B2 | * | 3/2008 | Saeki et al. | 341/101 |
| 2001/0028271 | A1 | * | 10/2001 | Andre | 330/251 |
| 2004/0090242 | A1 | * | 5/2004 | Lee et al. | 326/83 |

FOREIGN PATENT DOCUMENTS

| | | |
|---|---|---|
| JP | 09-172364 | 12/1995 |
| JP | 08-055483 | 2/1996 |
| JP | 2002 334578 | 11/2002 |
| KR | 1020030092506 | 12/2003 |

* cited by examiner

*Primary Examiner*—Long Nguyen
*Assistant Examiner*—Shikha Goyal
(74) *Attorney, Agent, or Firm*—Myers Bigel Sibley & Sajovec, P.A.

(57) ABSTRACT

A transmission line driver and a serial interface data transmission device including the same are provided. The transmission line driver includes a pre-driver configured to generate and output differential input data signals based on a serial transmission data signal, a differential amplifier configured to receive the differential input data signals and to output differential output data signals, and a common mode controller configured to drive the differential output data signals to a predetermined common mode voltage in an idle mode. Accordingly, power consumption can be reduced and a common mode specification can be supported.

16 Claims, 7 Drawing Sheets

TRANSMISSION LINE DRIVERS AND SERIAL INTERFACE DATA TRANSMISSION DEVICES INCLUDING THE SAME

CROSS-REFERENCE TO RELATED PATENT APPLICATION

This application claims the benefit of Korean Patent Application No. 10-2006-0069467, filed on Jul. 25, 2006, in the Korean Intellectual Property Office, the disclosure of which is incorporated herein in its entirety by reference.

FIELD OF THE INVENTION

The present invention relates to electronic circuits, and, more particularly, to transmission line drivers used in serial interface data transmission devices.

BACKGROUND OF THE INVENTION

Figure 1:
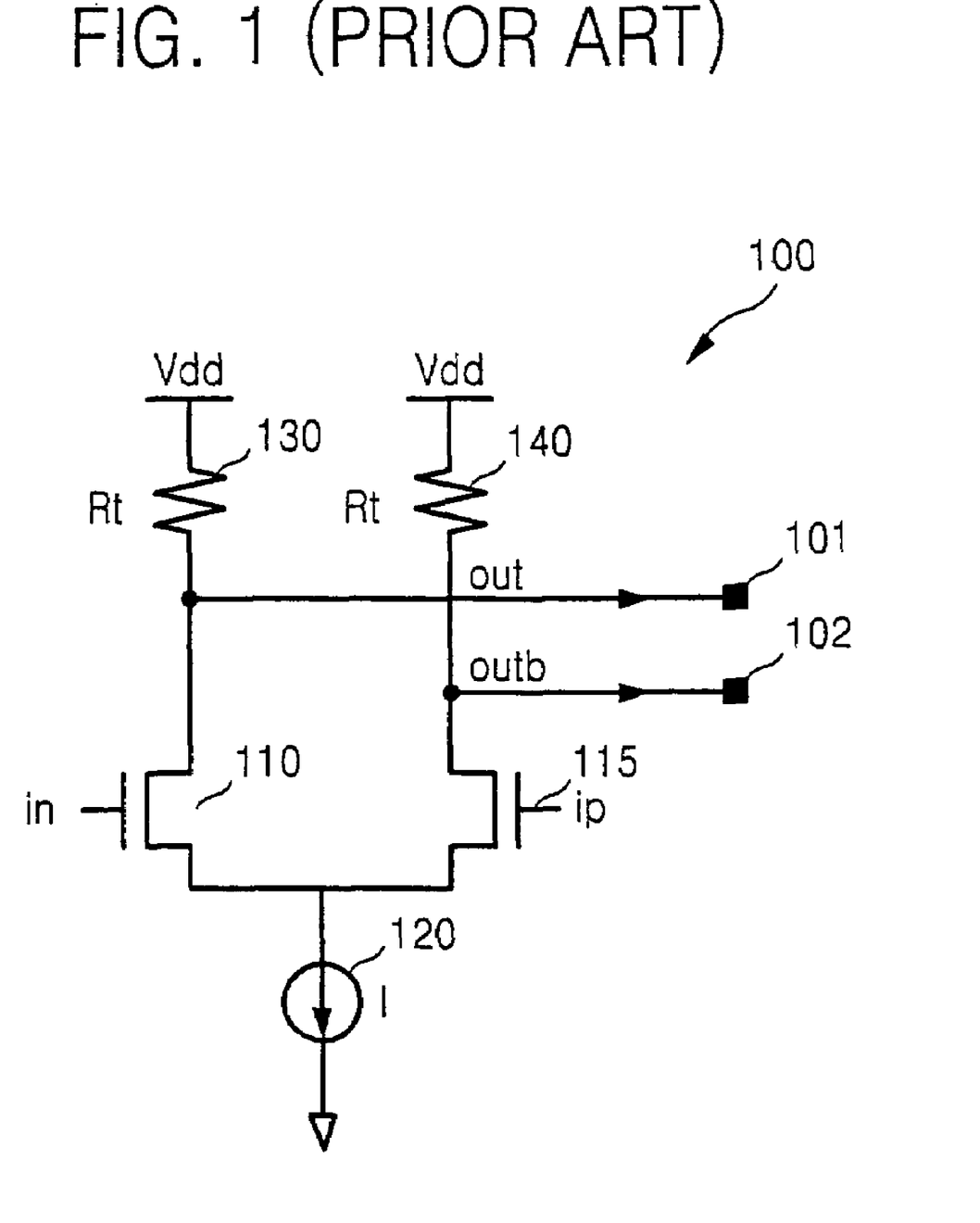
FIG. 1 illustrates a conventional transmission line driver.

FIG. 1 illustrates a conventional transmission line driver 100. The transmission line driver 100 is included in a high-speed serial interface device and has a source coupled logic (SCL) structure. The transmission line driver 100 includes a first transistor 110, a second transistor 115, a current source 120, a first resistor 130, and a second resistor 140 that are connected as shown.

The first transistor 110 is connected to a first power supply terminal and a first output terminal 101 and is switched in response to a first input signal "in" input from a first input terminal. The first transistor 110 is an NMOS transistor and is connected to the first power supply terminal via the current source 120. A ground voltage is applied to the first power supply terminal. A first output signal "out" is output via the first output terminal 101.

The second transistor 115 is connected to the first power supply terminal and a second output terminal 102 and is switched in response to a second input signal "ip" input from a second input terminal. Like the first transistor 110, the second transistor 115 is an NMOS transistor and is connected to the first power supply terminal via the current source 120. A second output signal "outb" is output via the second output terminal 102.

The first resistor 130 is connected to a second power supply terminal Vdd and the first output terminal 101 and the second resistor 140 is connected to the second power supply terminal Vdd and the second output terminal 102. The resistance value of the first and second resistors 130 and 140 is about the same as a terminal resistance value Rt (e.g., 50 ohms) of a differential transmission line connected with the first output terminal 101 and the second output terminal 102.

The first input signal "in" and the second input signal "ip" are generated based on a serial transmission data signal. In a normal mode, the first input signal "in" and the second input signal "ip" have different logic levels; therefore, the first transistor 110 and the second transistor 115 operate complementarily. Accordingly, a differential output voltage of the transmission line driver 100 (i.e., a difference between the first output signal "out" and the second output signal "outb") is I×(50Ω//50Ω) [V] in the normal mode. "I" is the amount of current flowing in the current source 120. When the differential output voltage is 1000 mV, I=20 [mA]. However, as a power supply voltage (e.g., Vdd) is decreased, influence of power consumption occurring in the transmission line driver 100 is increased. Therefore, it may be desirable to reduce the current "I" flowing in the current source 120, which induces power consumption in the transmission line driver 100.

SUMMARY OF THE INVENTION

Some embodiments of the present invention provide a transmission line driver for reducing power consumption and supporting a common mode specification in a serial interface data transmission device.

According to some embodiments of the present invention, there is provided a transmission line driver including a pre-driver configured to generate and output differential input data signals based on a serial transmission data signal, a differential amplifier configured to receive the differential input data signals and to output differential output data signals, and a common mode controller configured to drive the differential output data signals to a predetermined common mode voltage in an idle mode.

The transmission line driver may further include a bias unit configured to control a magnitude of the differential output data signals.

The differential amplifier may include a first switch pair connected to the bias unit and a first output terminal and a second output terminal, which respectively output the differential output data signals, and is responsive to the differential input data signals; a second switch pair connected to a first power supply terminal and the first and second output terminals and is responsive to the differential input data signals; and a first resistor connected between the first output terminal and the second output terminal.

The common mode controller may include a third switch pair connected to the first power supply terminal and the first and second output terminals and is responsive to an idle mode signal. The third switch pair may be connected to the first and second output terminals via a second resistor and a third resistor, respectively.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS OF THE INVENTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "\".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
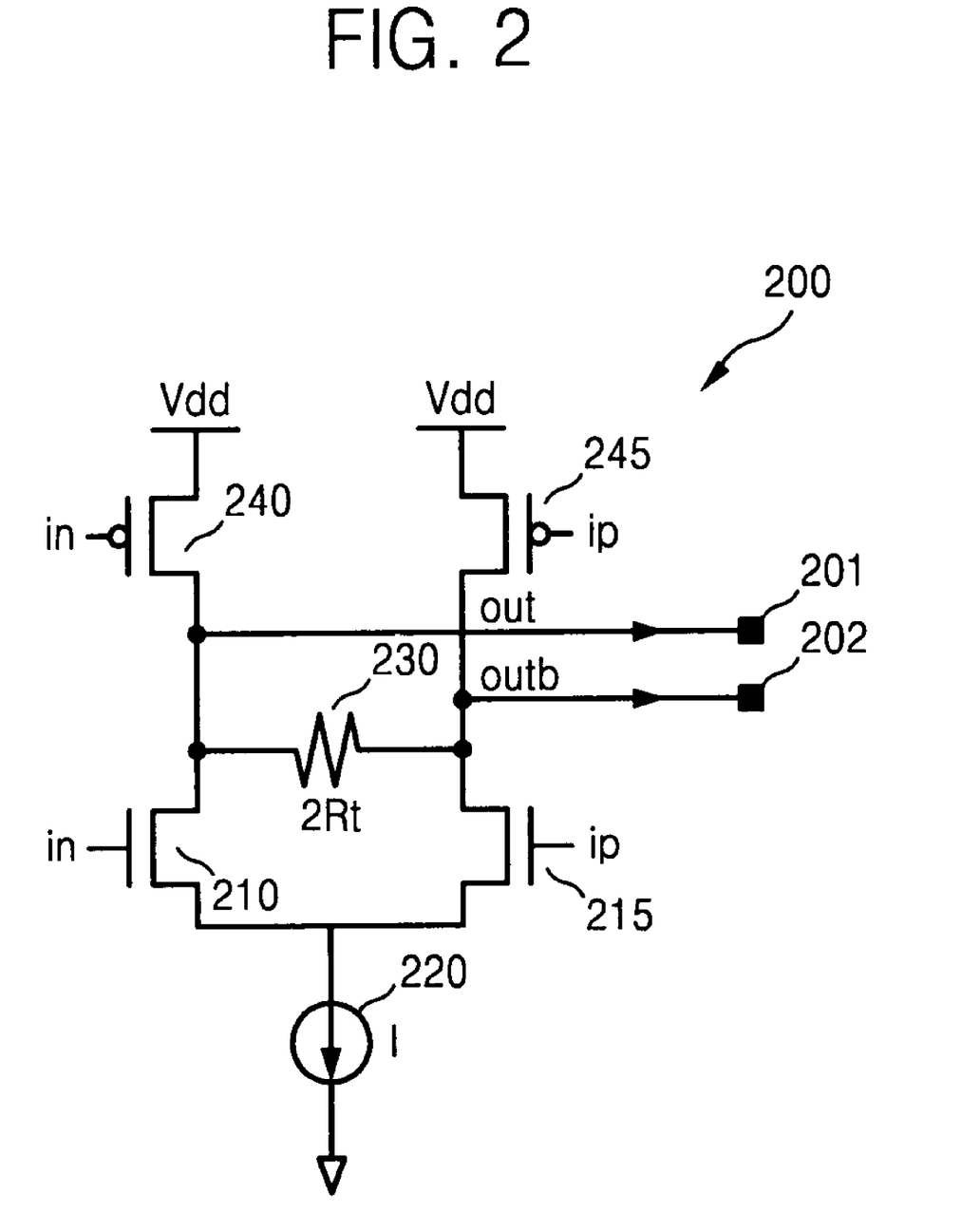
FIG. 2 illustrates a transmission line driver for reducing power consumption according to some embodiments of the present invention.

FIG. 2 illustrates the structure of a transmission line driver 200 for reducing power consumption according to some embodiments of the present invention. The transmission line driver 200 includes a first transistor 210, a second transistor 215, a current source 220, a first resistor 230, a third transistor 240, and a fourth transistor 245 that are connected as shown.

Referring to FIGS. 1 and 2, to realize the transmission line driver 200 for reducing power consumption, the first resistor 130 and the second resistor 140 in the conventional transmission line driver 100 are replaced with the third transistor 240 and the fourth transistor 245. The third and fourth transistors 240 and 245 may be PMOS transistors.

The transmission line driver 200 includes the first resistor 230, which has a resistance value (e.g., 100Ω) that is approximately double that of the terminal resistance value Rt (e.g., 50Ω) of the differential transmission line, between a first output terminal 201 and a second output terminal 202. Accordingly, when the transmission line driver 200 provides the same output voltage (e.g., 1000 mV) as that of the conventional transmission line driver 100, current I flowing in the current source 220 is about half of the current I flowing in the current source 120 in the conventional transmission line driver 100. However, the transmission line driver 200 is not designed to make a common mode voltage constant.

Serial advanced technology attachment (SATA) for transmitting data at high speed using a serial interface is a link standard for a hard disc drive, a digital versatile disc (DVD), a compact disc rewritable (CD-RW), etc. The SATA standard defines a common mode specification that a common mode voltage should be maintained within a predetermined range (DVdiff00B) in a normal mode and an idle mode.

Figure 3:
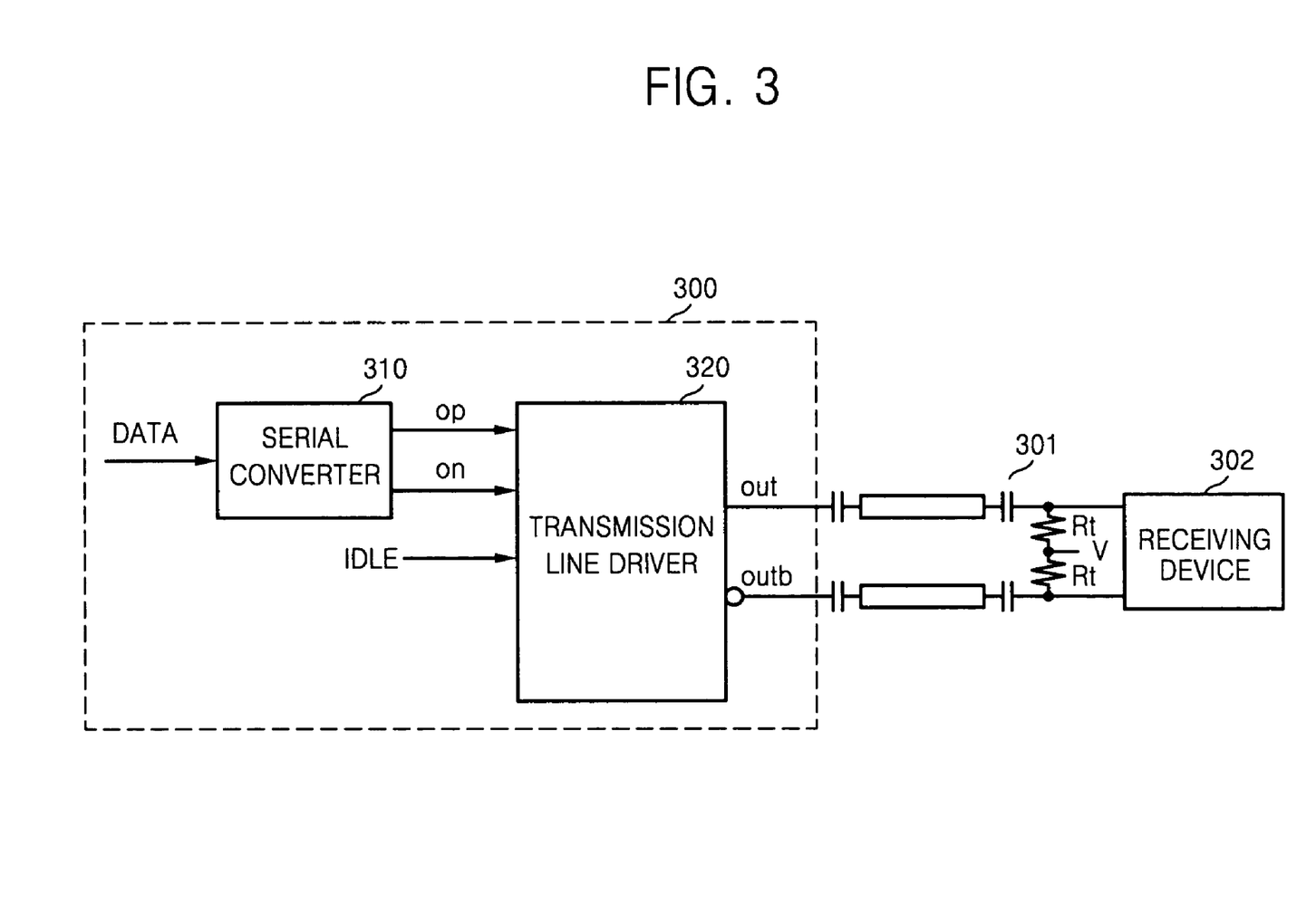
FIG. 3 is a block diagram of a serial interface data transmission device according to some embodiments of the present invention.

FIG. 3 is a block diagram of a serial interface data transmission device 300 according to some embodiments of the present invention. Referring to FIG. 3, the serial interface data transmission device 300 includes a serial converter 310 and a transmission line driver 320 that are connected as shown. The serial converter 310 converts parallel data DATA to be transmitted into a serial transmission data signal "op" and an inverted serial transmission data signal "on".

The transmission line driver 320 generates differential output data signals "out" and "outb" having a common mode voltage from the serial transmission data signal "op" and the inverted serial transmission data signal "on" based on an idle mode signal IDLE and outputs the differential output data signals "out" and "outb". The differential output data signals "out" and "outb" swing around the common mode voltage in the normal mode and have the common mode voltage in the idle mode. The differential output data signals "out" and "outb" are transmitted to a receiving device 302 via a transmission line 301. The transmission line 301 may be an alternating current (AC) to AC coupling transmission line for transmitting differential AC signals.

Figure 4:
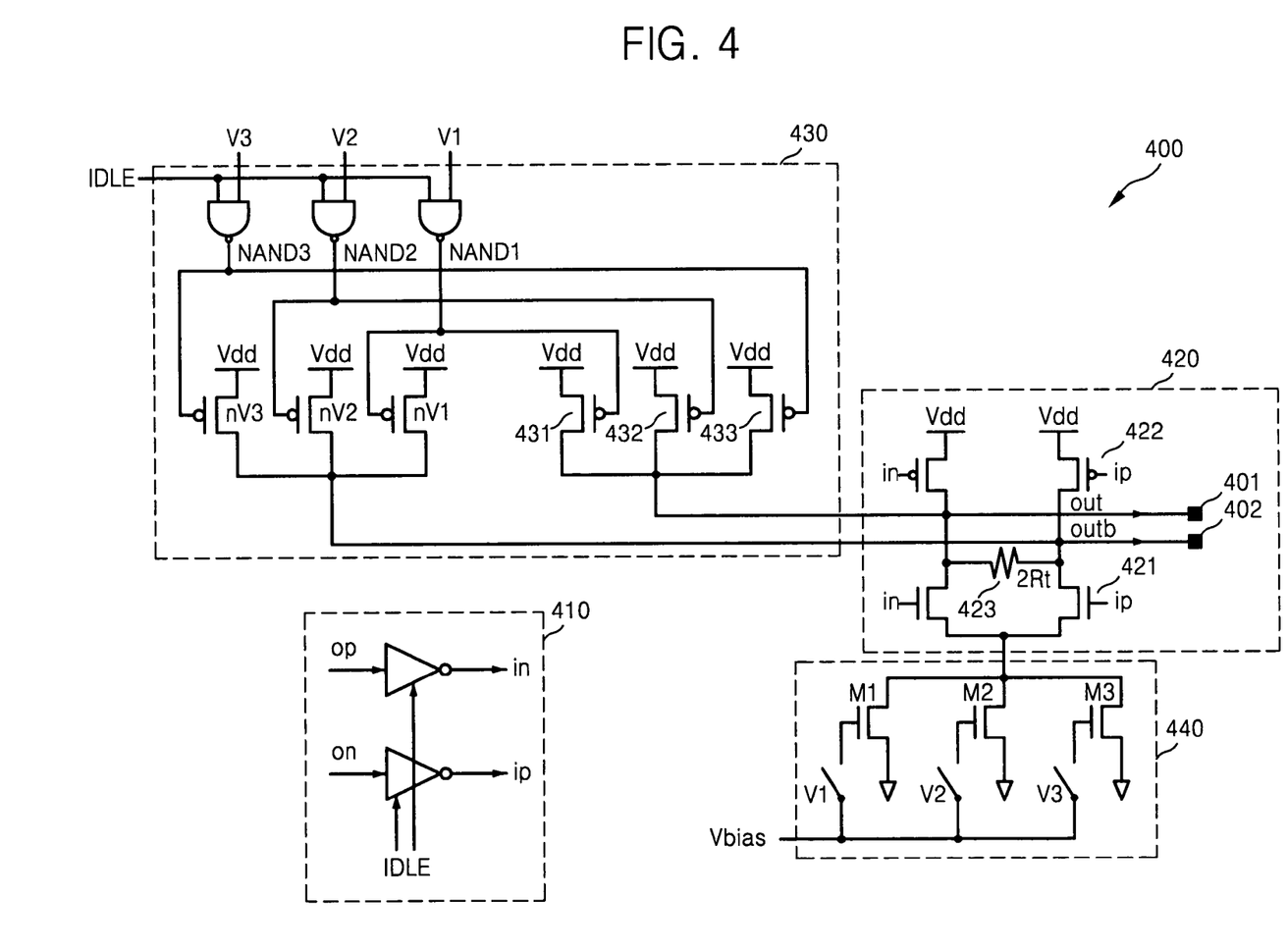
FIG. 4 is a circuit diagram of a transmission line driver according to some embodiments of the present invention.

FIG. 4 is a circuit diagram of a transmission line driver 400 according to some embodiments of the present invention. The transmission line driver 400 includes a pre-driver 410, a differential amplifier 420, a common mode controller 430, and a bias unit 440 that are connected as shown.

The pre-driver 410 generates and outputs differential input data signals "in" and "ip" based on the serial transmission data signal "op" and the inverted serial transmission data signal "on", which are transmitted from the serial converter 310. The pre-driver 410 outputs the differential input data signals "in" and "ip" by inverting the serial transmission data signal "op" and the inverted serial transmission data signal "on", respectively, in the normal mode and outputs both of the differential input data signals "in" and "ip" at a high level in the idle mode. The normal mode or the idle mode is set by the idle mode signal IDLE. When the idle mode signal IDLE is at a high level, the idle mode may be set. When the idle mode signal IDLE is at a low level, the normal mode may be set. It will be understood, however, that the present invention is not restricted to the aforementioned embodiments.

The differential amplifier 420 includes a first switch pair 421, a second switch pair 422, and a first resistor 423 that are connected as shown. The first switch pair 421 is connected with the bias unit 440 and also connected with a first output terminal 401 and a second output terminal 402, which respectively output the differential output data signals "out" and "outb". The first switch pair 421 is controlled by the differential input data signals "in" and "ip". The first switch pair 421 may be implemented using NMOS transistors. The second switch pair 422 is connected with a first power supply terminal Vdd and the first and second output terminals 401 and 402 and is controlled by the differential input data signals "in" and "ip". The second switch pair 422 may be implemented using PMOS transistors.

The first resistor 423 is connected between the second switch pair and the first and second output terminals 401 and 402. The first resistor 423 may have a resistance value 2Rt, which is about double of a terminal resistance value Rt of a transmission line connected with the first and the second output terminals 401 and 402.

The bias unit 440 includes switches M1, M2, and M3 controlled by first control signals V1, V2, and V3, respectively. Each of the switches M1, M2, and M3 may be implemented by an NMOS transistor. The switches M1, M2, and M3 control the magnitude of the differential output data signals "out" and "outb" of the transmission line driver 400 by controlling the current flowing in the differential amplifier 420 based on the first control signals V1, V2, and V3. At least one among the first control signals V1, V2, and V3 may be turned on. When the first control signals V1, V2, and V3 are at a high level, a bias voltage Vbias is applied to a gate of each of the switches M1, M2, and M3, which is an NMOS transistor, so that the switches M1, M2, and M3 are turned on.

The common mode controller 430 includes NAND gates NAND1, NAND2, and NAND3 and third switch pairs 431, 432, and 433. Each of the NAND gates NAND1, NAND2, and NAND3 performs a NAND operation with respect to the idle mode signal IDLE and a corresponding one among the first control signals V1, V2, and V3, thereby outputting second control signal nV1, nV2, or nV3. The third switch pairs 431, 432, and 433 are connected to the first power supply terminal Vdd and the first and second output terminals 401 and 402 and are controlled by the second control signals nV1, nV2, and nV3, respectively. Accordingly, the number of the third switch pairs 431, 432, and 433 may be the same as the number of the second control signals nV1, nV2, and nV3. In addition, the third switch pairs 431, 432, and 433 may be implemented using a PMOS transistor.

When (W/L of M1)>(W/L of M2)>(W/L of M3), where W/L is a channel width to length ratio in each of the switches M1, M2, and M3 controlled by the first control signals V1, V2, and V3, (W/L of the third switch pair 431)>(W/L of the third switch pair 432)>(W/L of the third switch pair 433) may be satisfied with respect to the third switch pairs 431, 432, and 433 respectively corresponding to the first control signals V1, V2, and V3.

In the normal mode, the idle mode signal IDLE is at the low level and the third switch pairs 431, 432, and 433 are all turned off, and thus the common mode controller 430 does not operate. Therefore, the structure of the transmission line driver 400 becomes the same as that of the transmission line driver 200 illustrated in FIG. 2. As a result, an amount of current necessary for outputting the differential output data signals "out" and "outb" is reduced by about half of the current needed in the conventional transmission line driver 100. In addition, the high-level voltage of the differential output data signals "out" and "outb" is VDD−(Im×Rds2) where VDD is a voltage of the first power supply terminal Vdd and the low-level voltage thereof is VDD−(Im×(Rds2+2Rt//2Rt)), and, therefore, the common mode voltage is VDD−(Im×(Rds2+Rt/2)). Here, "Im" is a current flowing into switches turned on among the switches M1, M2, and M3 and "Rds2" is a turn-on resistance value of the second switch pair 422.

In the idle mode, the idle mode signal IDLE is at the high level, and therefore, at least one switch among the switches M1, M2, and M3 is turned on by the first control signals V1, V2, and V3 and at least one switch pair among the third switch pairs 431, 432, and 433 is turned on. Accordingly, the common mode voltage is decreased by VDD−(Im/2)×Rdsp where "VDD" is a voltage of the first power supply terminal Vdd, "Im" is a current flowing into switches turned on among the switches M1, M2, and M3, and "Rdsp" is a parallel resistance value of a switch pair, which is turned on among the third switch pairs 431, 432, and 433.

Accordingly, the common mode voltage, VDD−(Im×(Rds2+Rt/2)), in the normal mode and the common mode voltage, VDD−(Im/2)×Rdsp, in the idle mode can be maintained within the predetermined range (DVdiff00B) defined in the specification by appropriately controlling the first control signals V1, V2, and V3, the first switch pair 421, the second switch pair 422, and the W/L of the third switch pairs 431, 432, and 433.

Figure 5:
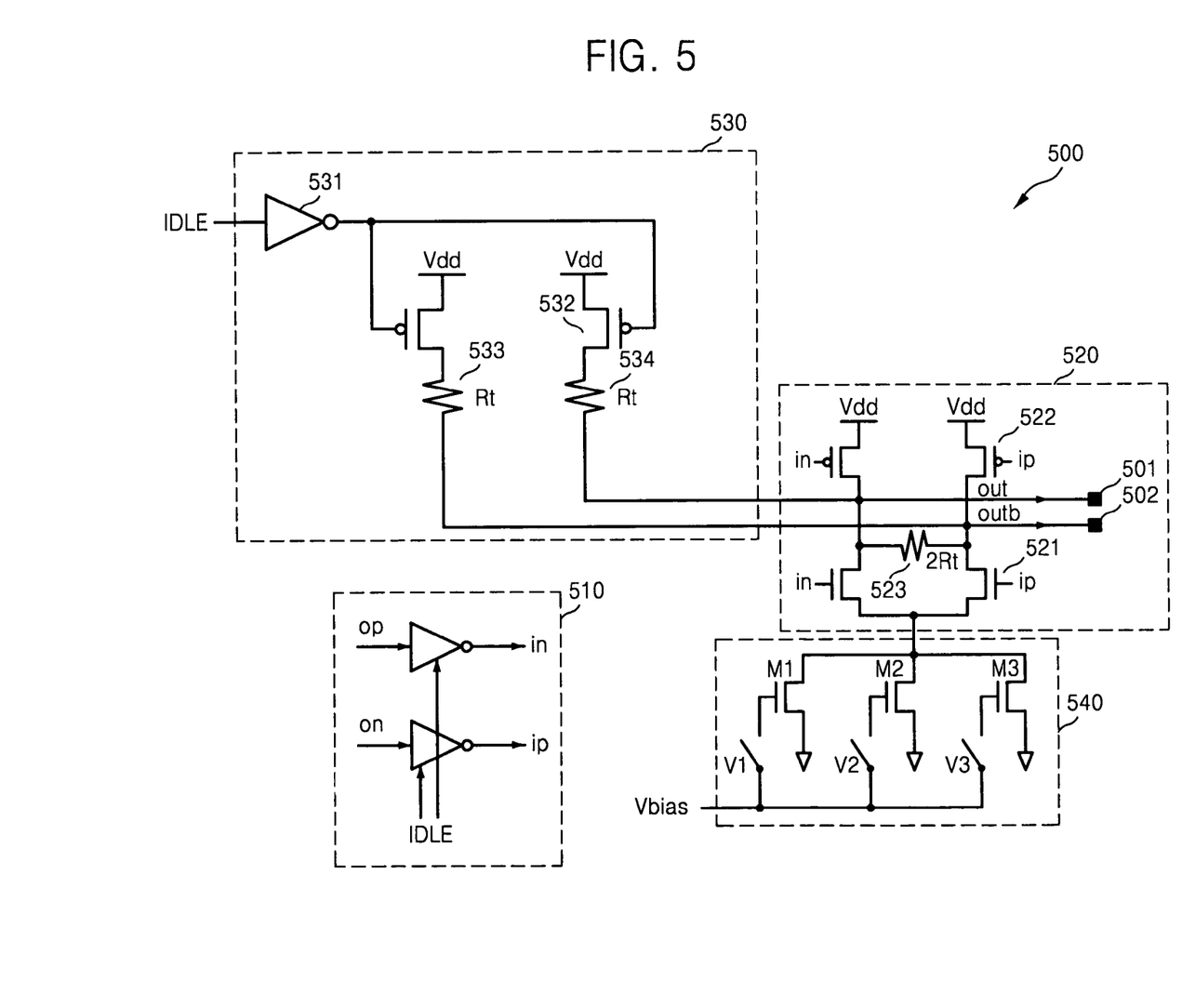
FIG. 5 is a circuit diagram of a transmission line driver according to other embodiments of the present invention.

FIG. 5 is a circuit diagram of a transmission line driver 500 according to other embodiments of the present invention. Referring to FIG. 5, the transmission line driver 500 includes a pre-driver 510, a differential amplifier 520, a common mode controller 530, and a bias unit 540 that are connected as shown.

The pre-driver 510 generates and outputs differential input data signals "in" and "ip" based on a serial transmission data signal "op" and an inverted serial transmission data signal "on", which are transmitted from a predetermined serial converter. The differential amplifier 520 includes a first switch pair 521, a second switch pair 522, and a first resistor 523. The differential amplifier 520 receives the differential input data signals "in" and "ip" and outputs differential output data signals "out" and "outb".

The bias unit 540 includes switches M1, M2, and M3 controlled by first control signals V1, V2, and V3, respectively, and controls the magnitude of the differential output data signals "out" and "outb". The pre-driver 510, the differential amplifier 520, and the bias unit 540 may be implemented in the same manner as the pre-driver 410, the differential amplifier 420, and the bias unit 440 included in the transmission line driver 400. Thus, detailed descriptions thereof will be omitted.

The common mode controller 530 includes an inverter 531, a third switch pair 532, a second resistor 533, and a third resistor 534. The inverter 531 inverts and outputs the idle mode signal IDLE. The idle mode signal IDLE may be at the high level in the idle mode and be at the low level in the normal mode.

The third switch pair 532 is connected to the first power supply terminal Vdd, a first output terminal 501, and a second output terminal 502 and is controlled by the inverted idle mode signal IDLE output from the inverter 531. The third switch pair 532 is connected to the first and second output terminals 501 and 502 via the second resistor 533 and the third resistor 534, respectively. The second and third resistors 533 and 534 may have about the same resistance value as a terminal resistance value Rt of a transmission line connected with the first and second output terminals 501 and 502. In addition, the third switch pair 532 may be implemented using a PMOS transistor and may have about half of the W/L of a PMOS transistor in the second switch pair 522.

In the normal mode, the idle mode signal IDLE is at the low level and the third switch pair 532 is turned off; therefore, the common mode controller 530 does not operate. Accordingly, the transmission line driver 500 may have the same structure as the transmission line driver 200 illustrated in FIG. 2. As a result, current necessary for outputting the differential output data signals of the same amplitude "out" and "outb" is reduced by about half of the current needed in the typical transmission line driver 100. In addition, like the transmission line driver 400 illustrated in FIG. 4, the transmission line driver 500 has a common mode voltage of VDD−(Im×(Rds2+Rt/2)). Here, "Rds2" is a turn-on resistance value of the PMOS transistor included in the second switch pair 522.

In the idle mode, the idle mode signal IDLE is at the high level and the third. switch pair 532 is turned on; therefore, a current of Im/2, which is about half of the current Im flowing to the bias unit 540, flows via each switch in the third switch pair 532. As a result, the common mode voltage becomes VDD−((Im/2)×(Rds3+Rt)) where "Rds3" is a turn-on resistance value of the PMOS transistor included in the third switch pair 532.

As mentioned above, a ratio of the W/L of the second switch pair 522 to the W/L of the third switch pair 532 is about 2:1; therefore, "Rds3" is about double that of "Rds2". Accordingly, the common mode voltage is substantially constant in the normal mode and the idle mode.

Figure 6A:
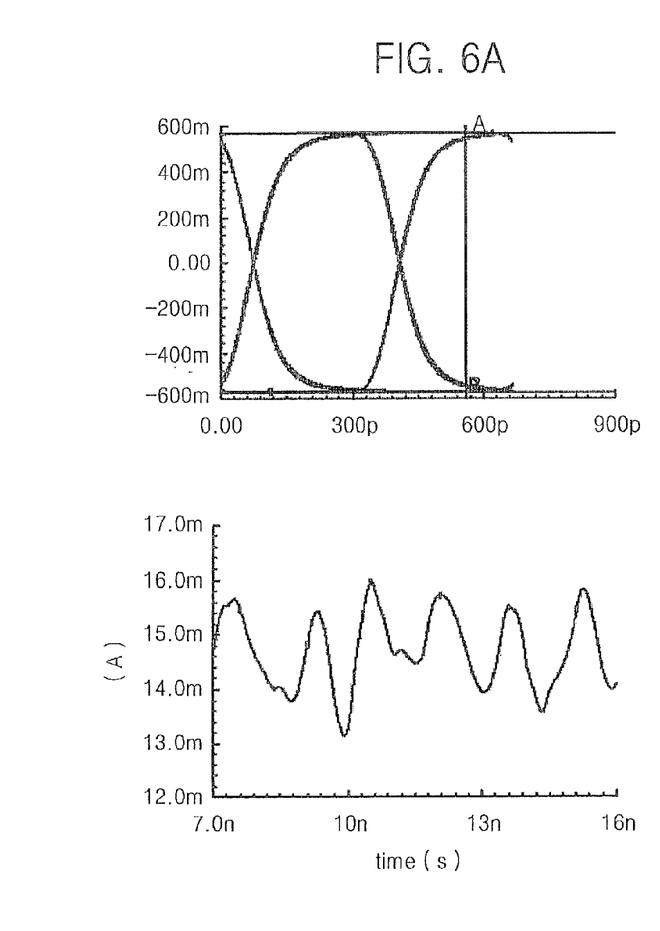
FIG. 6A illustrates an output of a transmission line driver according to some embodiments of the present invention.
Figure 6B:
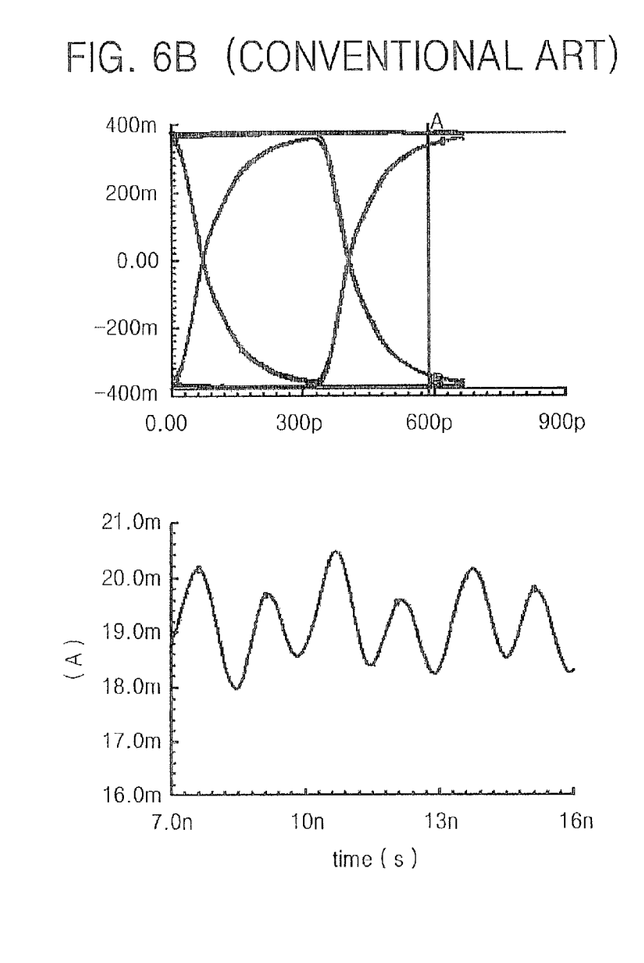
FIG. 6B illustrates an output of a conventional transmission line driver.

FIG. 6A illustrates an output of the transmission line driver 400 or 500 according to some embodiments of the present invention. FIG. 6B illustrates an output of the conventional transmission line driver 100. Referring to FIGS. 6A and 6B, while a current of 15 mA flows at a differential output voltage of 750 mV in the conventional transmission line driver 100, a current of 11 mA flows at a differential output voltage of 1100 mV in the transmission line driver 400 or 500. Accordingly, it can be seen that an output resistance (1100/11=100) of the transmission line driver 400 or 500 is double of an output resistance (750/15=50) of the conventional transmission line driver 100. As a result, only half of the current necessary for a differential output voltage in the conventional transmission line driver 100 is needed in the transmission line driver 400 or 500 for the same differential output voltage; therefore, power consumption may be reduced in the transmission line driver 400 or 500 according to some embodiments of the present invention.

Figure 7:
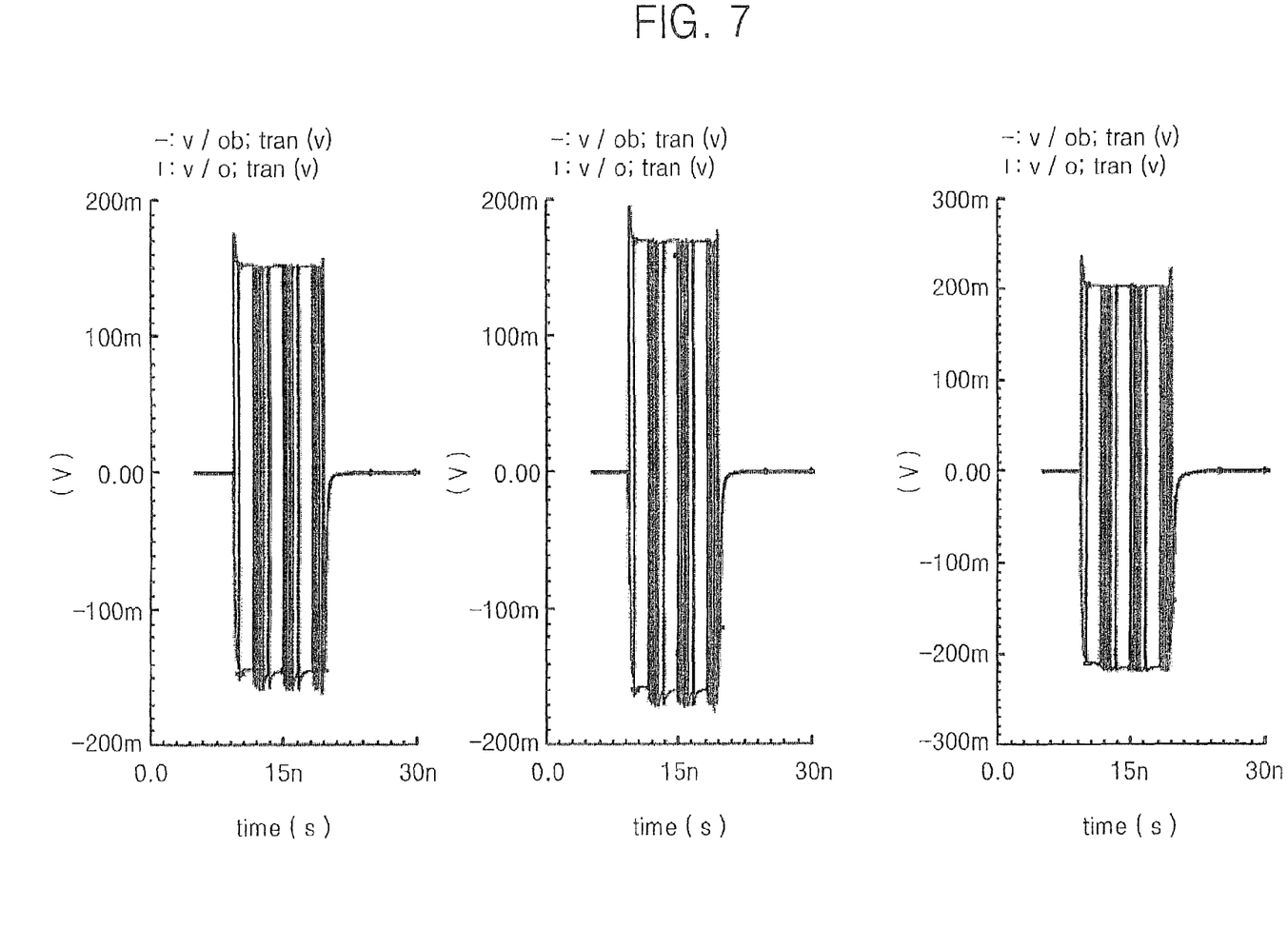
FIG. 7 illustrates outputs of a transmission line driver according to bias voltages in some embodiments of the present invention.

FIG. 7 illustrates outputs of the transmission line drivers 400 and 500 according to bias voltages in some embodiments of the present invention. It can be seen from FIG. 7 that the common mode voltage is maintained constant even if the differential output voltage changes in the normal and idle modes in the transmission line drivers 400 and 500.

As described above, according to some embodiments of the present invention, a transmission line driver and a serial interface data transmission device including the same include an idle mode controller that is turned on or off based on an idle mode signal, thereby maintaining a common mode voltage constant both in an idle mode and a normal mode. In addition, a resistor may be included between differential output terminals, thereby reducing power consumption.

While the present invention has been shown and described with reference to exemplary embodiments thereof, it will be understood by those of ordinary skill in the art that various changes in form and detail may be made herein without departing from the spirit and scope of the present invention, as defined by the following claims.

That which is claimed:

1. A transmission line driver, comprising:
   a pre-driver configured to generate and output differential input data signals based on a serial transmission data signal;
   a differential amplifier configured to receive the differential input data signals through a first input terminal and a second input terminal and to output differential output data signals through a first output terminal and a second output terminal; and
   a common mode controller configured to drive the differential output data signals to a predetermined common mode voltage in an idle mode and configured to be turned off in a normal mode;
   wherein the common mode controller comprises:
   a plurality of switch pairs connected to the first power supply terminal and the first and second output terminals, the plurality of switch pairs being responsive to logic operation result signals that are generated based on an idle mode signal and a plurality of predetermined control signals.

2. The transmission line driver of claim 1, further comprising a bias unit configured to control a magnitude of the differential output data signals.

3. The transmission line driver of claim 2, wherein the differential amplifier comprises:
   a first switch pair connected to the bias unit and the first output terminal and the second output terminal, which respectively output the differential output data signals, and responsive to the differential input data signals;
   a second switch pair connected to the first power supply terminal and the first and second output terminals and responsive to the differential input data signals; and
   a first resistor connected between the first output terminal and the second output terminal.

4. The transmission line driver of claim 3, wherein the common mode controller comprises a third switch pair connected to the first power supply terminal and the first and second output terminals and responsive to an idle mode signal;
   wherein the third switch pair is connected to the first and second output terminals via a second resistor and a third resistor, respectively.

5. The transmission line driver of claim 4, wherein the second resistor and the third resistor have about the same resistance value as a resistance value of a transmission line connected to the first and second output terminals;
   wherein the first resistor has a resistance value that is about double that of the resistance value of the transmission line.

6. The transmission line driver of claim 4, wherein the first switch pair comprises switches implemented by NMOS transistors, and
   wherein the second switch pair and the third switch pair comprise switches implemented by PMOS transistors.

7. The transmission line driver of claim 6, wherein the bias unit comprises a plurality of bias supply transistors each comprising a first terminal connected to a terminal of the first switch pair, a second terminal connected to a second power supply terminal, and a third terminal that receives a bias voltage based on a corresponding control signal among a plurality of predetermined control signals.

8. The transmission line driver of claim 6, wherein a channel width to length ratio of the second switch pair PMOS transistors is about double that of a channel width to length ratio of the third switch pair PMOS transistors.

9. The transmission line driver of claim 3, wherein the common mode controller further comprises:
   a plurality of logic operation elements configured to perform a logic operation with respect to the idle mode signal and the plurality of predetermined control signals, respectively, and to output the logic operation result signals.

10. The transmission line driver of claim 9, wherein the first resistor has a resistance value that is about double that of a resistance value of a transmission line connected to the first output terminal and the second output terminal.

11. The transmission line driver of claim 9, wherein the first switch pair comprises switches implemented by NMOS transistors, and wherein the second switch pair and the plurality of switch pairs comprise switches implemented by PMOS transistors.

12. The transmission line driver of claim 11, wherein the bias unit comprises a plurality of bias supply transistors each comprising a first terminal connected to a terminal of the first switch pair, a second terminal connected to a second power supply terminal, and a third terminal that receives a bias voltage based on a corresponding control signal among a the plurality of predetermined control signals.

13. The transmission line driver of claim 12, wherein a channel width to length ratio of each of the PMOS transistors of the plurality of switch pairs is proportional to a channel width to length ratio of a corresponding bias supply transistor among the plurality of bias supply transistors.

14. A serial interface data transmission device, comprising:
a serial converter configured to convert and output parallel data to be transmitted as serial transmission data signals; and
a transmission line driver configured to generate and output differential output data signals having a predetermined common mode voltage responsive to the serial transmission data signals and an idle mode signal,
wherein the transmission line driver comprises:
a pre-driver configured to generate and output differential input data signals based on the serial transmission data signal;
a differential amplifier configured to receive the differential input data signals through a first input terminal and a second input terminal and to output differential output data signals through a first output terminal and a second output terminal; and
a common mode controller configured to drive the differential output data signals to a predetermined common mode voltage in an idle mode and configured to be turned off in a normal mode;
wherein the common mode controller comprises:
a plurality of switch pairs connected to the first power supply terminal and the first and second output terminals, the plurality of switch pairs being responsive to logic operation result signals that are generated based on an idle mode signal and a plurality of predetermined control signals.

15. The serial interface data transmission device of claim 14, wherein the transmission line driver further comprises a bias unit configured to control a magnitude of the differential output data signals.

16. The serial interface data transmission device of claim 14, wherein the common mode controller further comprises:
a plurality of logic operation elements configured to perform a logic operation with respect to the idle mode signal and the plurality of predetermined control signals, respectively, and to output the logic operation result signals.

* * * * *